United States Patent
Codd et al.

(10) Patent No.: US 9,839,117 B2
(45) Date of Patent: Dec. 5, 2017

(54) FLEXIBLE PRINTED CIRCUIT WITH ENHANCED GROUND PLANE CONNECTIVITY

(71) Applicant: Microsoft Technology Licensing, LLC, Redmond, WA (US)

(72) Inventors: Patrick Codd, Belmont, CA (US); Agustya Mehta, Mountain View, CA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 15/095,581

(22) Filed: Apr. 11, 2016

(65) Prior Publication Data

US 2017/0295642 A1    Oct. 12, 2017

(51) Int. Cl.
*H05K 1/00* (2006.01)
*H05K 1/02* (2006.01)
(Continued)

(52) U.S. Cl.
CPC ....... *H05K 1/0216* (2013.01); *G02B 27/0176* (2013.01); *H05K 1/028* (2013.01);
(Continued)

(58) Field of Classification Search
CPC .... H05K 1/0216; H05K 1/0296; H05K 1/118; H05K 1/14; H05K 1/028; G02B 27/0176
(Continued)

(56) References Cited

U.S. PATENT DOCUMENTS 5,165,055 A    11/1992  Metsler
5,296,651 A *  3/1994  Gurrie ................. H05K 1/0218
                                                            174/250
(Continued)

FOREIGN PATENT DOCUMENTS

CN    101226820 B    7/2010
CN    203289498 U    11/2013
(Continued)

OTHER PUBLICATIONS

Cracraft, et al., "Flexible PCB Grounding Connections for Hybrid Systems", In Proceedings of IEEE International Symposium on Electromagnetic Compatibility, Aug. 5, 2013, pp. 466-471 (6 pages total).

(Continued)

Primary Examiner — Sherman Ng
(74) Attorney, Agent, or Firm — Mark K. Young; Mayer & Williams PC

(57) ABSTRACT

In an electronic device having a compact form factor, such as a head mounted display device, flexible printed circuits may be utilized to provide interconnects between EMI-generating peripheral components and other components in the device such as those populated on main circuit boards. Coverlays utilized to protect circuit traces and ground planes in the flexible printed circuits are configured with openings that can expose ground planes at various locations throughout the electronic device. Electrical pathways are formed by conductive foam, conductive adhesives, and/or other conductive materials between the exposed ground planes and a device ground to establish multiple ground loops throughout the device that shunt EMI energy that is generated by electronic components and circuits during device operation. The coverlay openings can be positioned on the flexible printed circuits so that the lengths of the ground loops are (Continued)

minimized to enhance overall EMI emission management performance.

19 Claims, 19 Drawing Sheets

(51) Int. Cl.
   *H05K 1/11* (2006.01)
   *H05K 1/14* (2006.01)
   *G02B 27/01* (2006.01)
(52) U.S. Cl.
   CPC .......... *H05K 1/0296* (2013.01); *H05K 1/118* (2013.01); *H05K 1/14* (2013.01)
(58) Field of Classification Search
   USPC ........................................................ 174/254
   See application file for complete search history.

(56) References Cited

U.S. PATENT DOCUMENTS

| | | | |
|---|---|---|---|
| 5,917,149 A * | 6/1999 | Barcley | H05K 1/0281 174/36 |
| 6,160,349 A | 12/2000 | Nagai | |
| 6,255,582 B1 | 7/2001 | Miller et al. | |
| 7,402,884 B2 | 7/2008 | Xie | |
| 7,404,250 B2 | 7/2008 | Cheng et al. | |
| 7,439,449 B1 | 10/2008 | Kumar et al. | |
| 7,629,537 B2 | 12/2009 | Ice | |
| 7,672,142 B2 | 3/2010 | Wang et al. | |
| 7,869,206 B2 | 1/2011 | Dabov et al. | |
| 7,916,089 B2 | 3/2011 | Schlub et al. | |
| 8,058,559 B2 | 11/2011 | Muro et al. | |
| 8,072,304 B2 | 12/2011 | Kato et al. | |
| 8,308,509 B2 | 11/2012 | Karam | |
| 8,432,322 B2 | 4/2013 | Amm et al. | |
| 2002/0015293 A1 | 2/2002 | Akiba | |
| 2002/0075096 A1 | 6/2002 | Anthony | |
| 2004/0065962 A1 | 4/2004 | Shinomiya | |
| 2005/0001905 A1 | 1/2005 | Shinomiya | |
| 2005/0116235 A1 | 6/2005 | Schultz et al. | |
| 2006/0067199 A1 | 3/2006 | Tanaka | |
| 2006/0126311 A1 | 6/2006 | Hall | |
| 2007/0215962 A1 | 9/2007 | Minervini | |
| 2008/0143871 A1 | 6/2008 | Go | |
| 2008/0164055 A1 * | 7/2008 | Wang | G06F 1/189 174/260 |
| 2009/0058559 A1 | 3/2009 | Pakkala | |
| 2009/0079716 A1 | 3/2009 | Kim | |
| 2009/0201399 A1 | 8/2009 | Senga | |
| 2009/0231226 A1 | 9/2009 | Quan et al. | |
| 2009/0294155 A1 * | 12/2009 | Suzuki | H05K 1/0218 174/254 |
| 2011/0255250 A1 | 10/2011 | Dinh et al. | |
| 2011/0285972 A1 | 11/2011 | Hu | |
| 2014/0092034 A1 | 4/2014 | Franklin et al. | |
| 2014/0111684 A1 | 4/2014 | Corbin et al. | |
| 2014/0140018 A1 | 5/2014 | Malek et al. | |
| 2016/0070296 A1 | 3/2016 | Koo | |

FOREIGN PATENT DOCUMENTS

| | | |
|---|---|---|
| KR | 20080028210 A | 3/2008 |
| KR | 20090037654 A | 4/2009 |
| WO | 2006/098076 A1 | 9/2006 |
| WO | 2014000828 A1 | 1/2014 |

OTHER PUBLICATIONS

Tan, et al., "A Common-Mode Choke Using Toroid-EQ Mixed Structure", In Proceedings of IEEE Transactions on Power Electronics, vol. 28, Issue 1, Jan. 2013, pp. 31-35. (5 pages total).
"WE-FLAT Ferrite for Flexible Printed Circuit Boards", Retrieved on: Feb. 27, 2015 Available at: http://katalog.we-online.de/en/pbs/WE-FLAT_Flachkern_fuer_flexible_Leiterplatten#vs_t2:2_t1:1 (2 pages total).
International Search Report and Written Opinion dated Aug. 28, 2017, issued in connection with corresponding International Application No. PCT/US17/021461 (14 pages total).

* cited by examiner

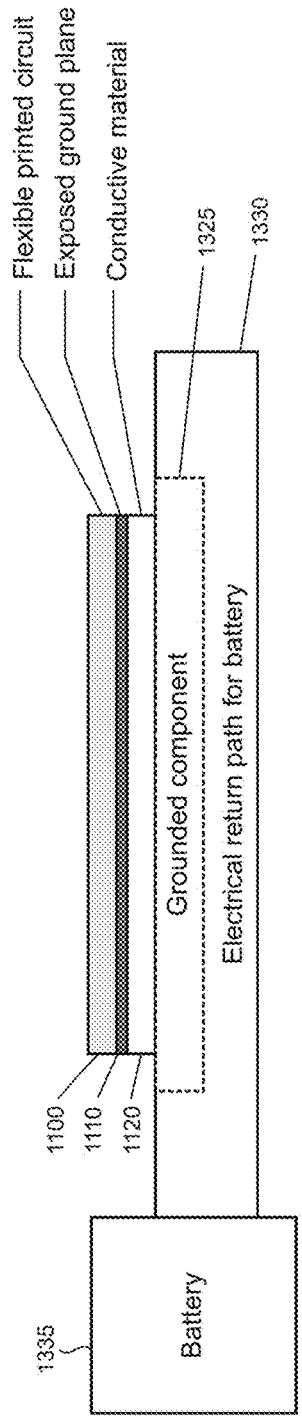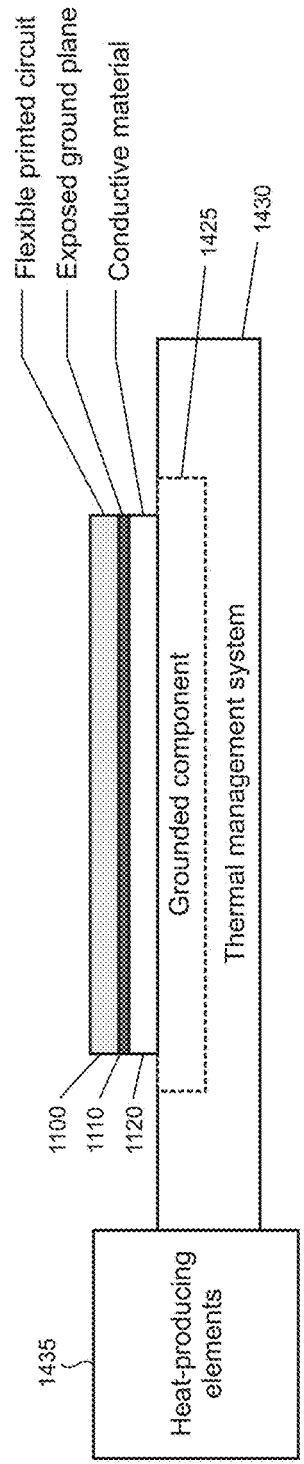

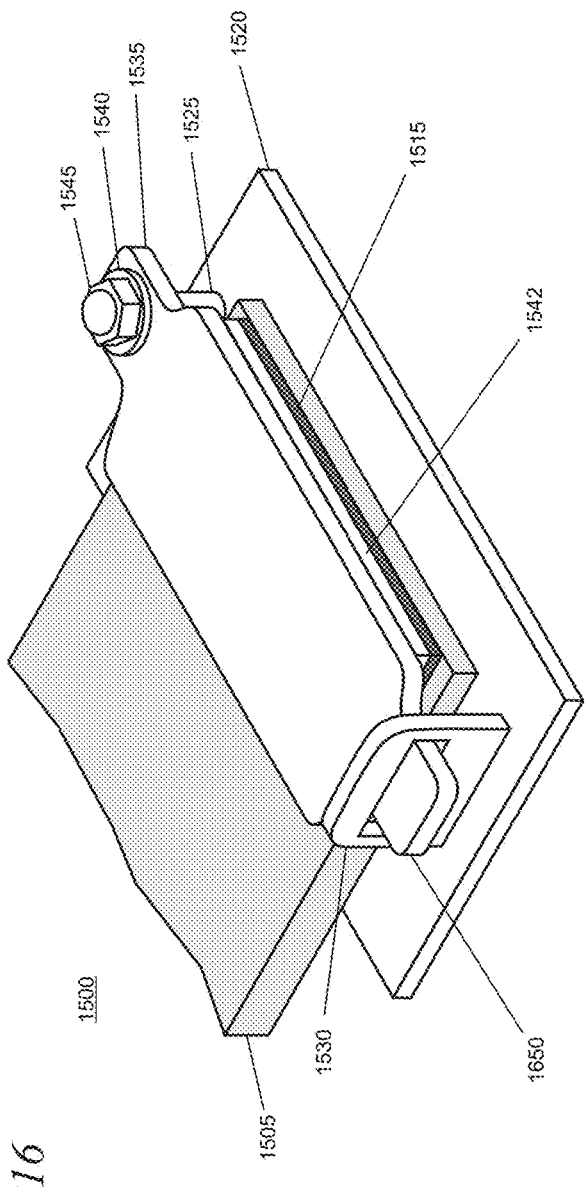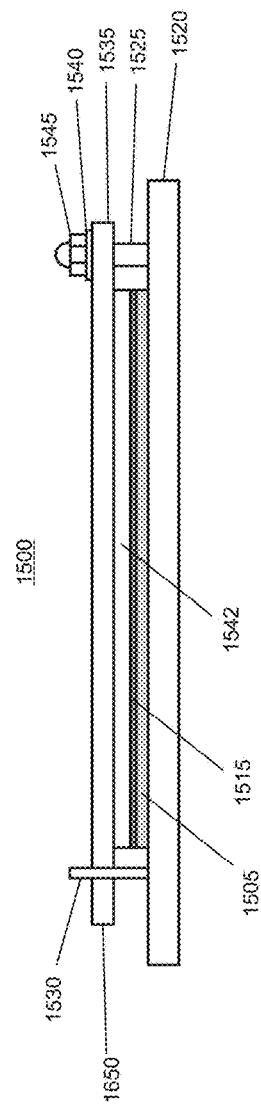
FIG 16
FIG 17

FLEXIBLE PRINTED CIRCUIT WITH ENHANCED GROUND PLANE CONNECTIVITY

BACKGROUND

Electro-magnetic interference (EMI) is typically emitted within the radio frequency (RF) spectrum during the operation of electronic devices.

SUMMARY

In an electronic device having a compact form factor, such as a head mounted display (HMD) device, flexible printed circuits may be utilized to provide interconnects between EMI-generating peripheral components and other components in the device such as those populated on main circuit boards. Coverlays utilized to protect circuit traces and ground planes in the flexible printed circuits are configured with openings that can expose ground planes at various locations throughout the electronic device. Electrical pathways are formed by conductive foam, conductive adhesives, and/or other conductive materials between the exposed ground planes and a device ground to establish multiple ground loops throughout the device that shunt EMI energy that is generated by electronic components and circuits in device operation. The coverlay openings can be positioned on the flexible printed circuits so that the lengths of the ground loops are minimized to enhance overall EMI emission management performance for the electronic device.

The flexible printed circuits may be configured so that the coverlay openings are positioned within a compact form factor electronic device to enable ground loops to be established utilizing constituent device components which may also be configured to serve other (i.e., non-ground loop) purposes in the electronic device to thereby perform "double duty" in some implementations. Device components may incorporate structural features or elements such as mechanical hardware, housings, frames, and cowlings and/or functional features or elements such as electrical return paths and elements utilized to dissipate thermal energy. Such flexible printed circuit configuration can enable enhanced ground plane connectivity throughout the electronic device which can be advantageous particularly for small form factor devices where space is limited and packaging constraints may dictate selection, configuration, and locations for electronic components and circuits that may otherwise contribute to sub-optimal EMI emission management. In various illustrative examples, a coverlay opening can be positioned on a flexible printed circuit to enable EMI energy to be shunted close to the source through a ground loop. The ground loop may be formed with grounded metal cowling (a structural member of the device) using conductive foam or adhesive that is applied to the ground plane exposed through the opening in the coverlay.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. Furthermore, the claimed subject matter is not limited to implementations that solve any or all disadvantages noted in any part of this disclosure. These and various other features will be apparent from a reading of the following Detailed Description and a review of the associated drawings.

DESCRIPTION OF THE DRAWINGS

FIGS. 13 and 14 show schematic diagrams of a ground plane in an illustrative flexible printed circuit being electrically coupled with a conductive material to a grounded component, in which the grounded component is incorporated in a functional element of an electronic device;

FIG. 16 shows an assembled view of the illustrative embodiment of the flexible printed circuit sub-assembly;

FIG. 17 shows a front view of the illustrative embodiment of the flexible printed circuit sub-assembly;

Like reference numerals indicate like elements in the drawings. Elements are not drawn to scale unless otherwise indicated.

DETAILED DESCRIPTION

Figure 1:
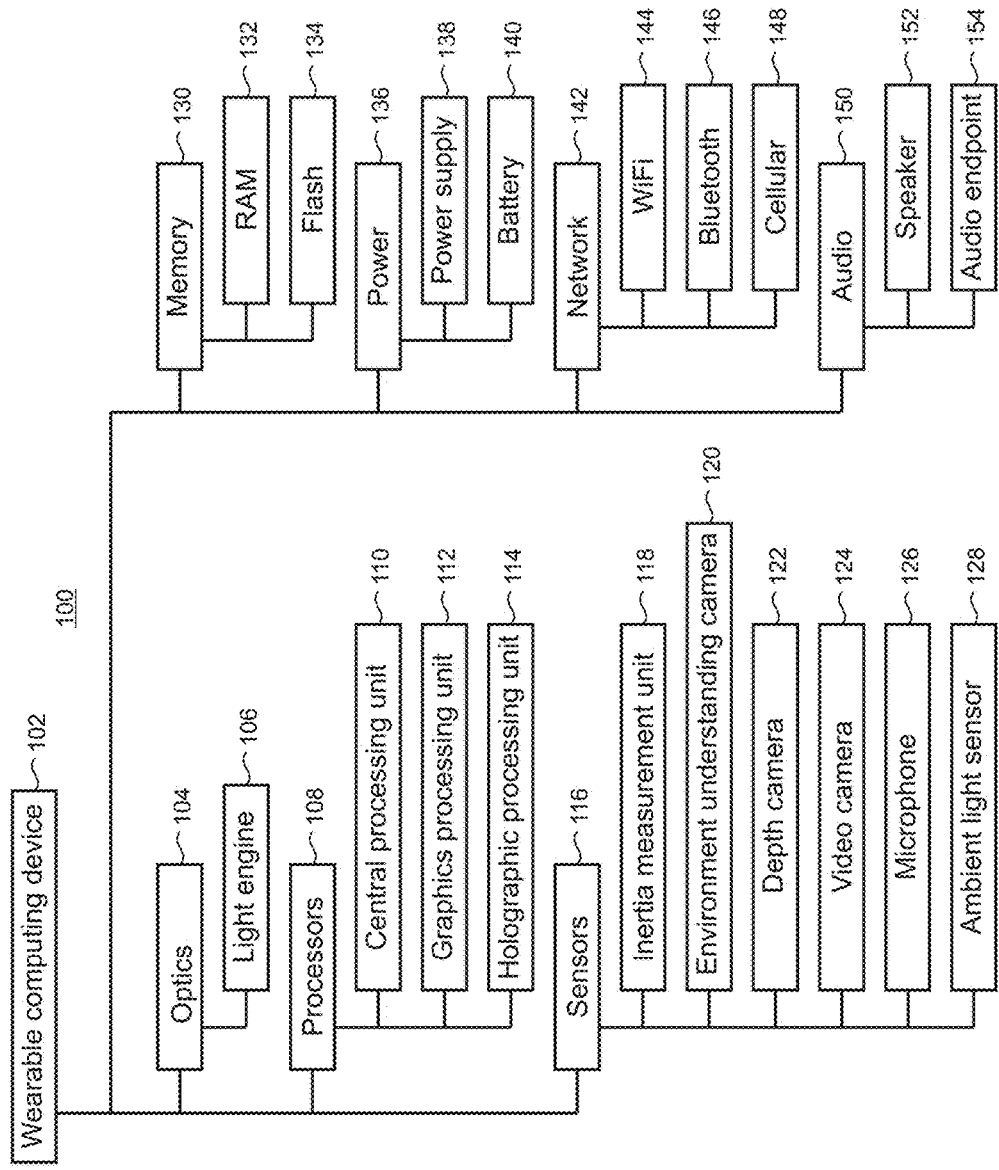
FIG. 1 is a block diagram of an illustrative arrangement of electronic components that may be included in a compact form factor electronic device and which may be sources of electro-magnetic interference (EMI) energy during device operation.

FIG. 1 is a high-level functional block diagram of an illustrative arrangement of electronic components 100 that may be included in a compact form factor electronic device such as a wearable computing device 102 (illustrative examples of which are described below). The components shown are illustrative and not every component may be utilized in a given device implementation. In addition, single or multiple instances of a component may be used in some implementations. For example, a device may have multiple processors and sensors. The components 100 and associated circuits and interconnects in the device 102 may be sources of electro-magnetic interference (EMI) energy when the device 102 operates. EMI emission typically needs to be managed in electronic devices and can fall under various regulatory schemes and standards such as Title 47, Part 15, Subpart B of the rules and regulations of the Federal Communications Commission (FCC) in the United States.

Since compact form factor electronic devices have inherent limitations on space, the electronic components 100 typically need to be packaged in the device 102 in a way that meets the design goals covering a variety of characteristics, features, and user experiences supported by the device. So, for example, optimization of ergonomic and usage factors may result in sub-optimal EMI emission characteristics. Device designers typically engage in some balancing of factors, characteristics, and performance in order to meet their goals. The present flexible printed circuit with enhanced ground plane connectivity may be anticipated to enhance flexibility and provide additional design freedom while still effectively dealing with EMI emission management.

As shown in FIG. 1, the components include: optics 104 such as light engine 106; processors 108 such as a central processing unit 110, graphics processing unit 112, and holographic processing unit 114; sensors 116 such as inertia measurement unit 118, environment understanding camera 120, depth camera 122, video camera 124, microphone 126, and ambient light sensor 128; memory 130 such as RAM 132 and flash 134; power 136 such as power supply 138 and battery 140; network 142 such as WiFi network interface 144, Bluetooth network interface 146, and cellular network interface 148; and audio 150 such as speaker 152 and support for an audio endpoint 154, including headsets, earphones, and the like.

Figure 2:
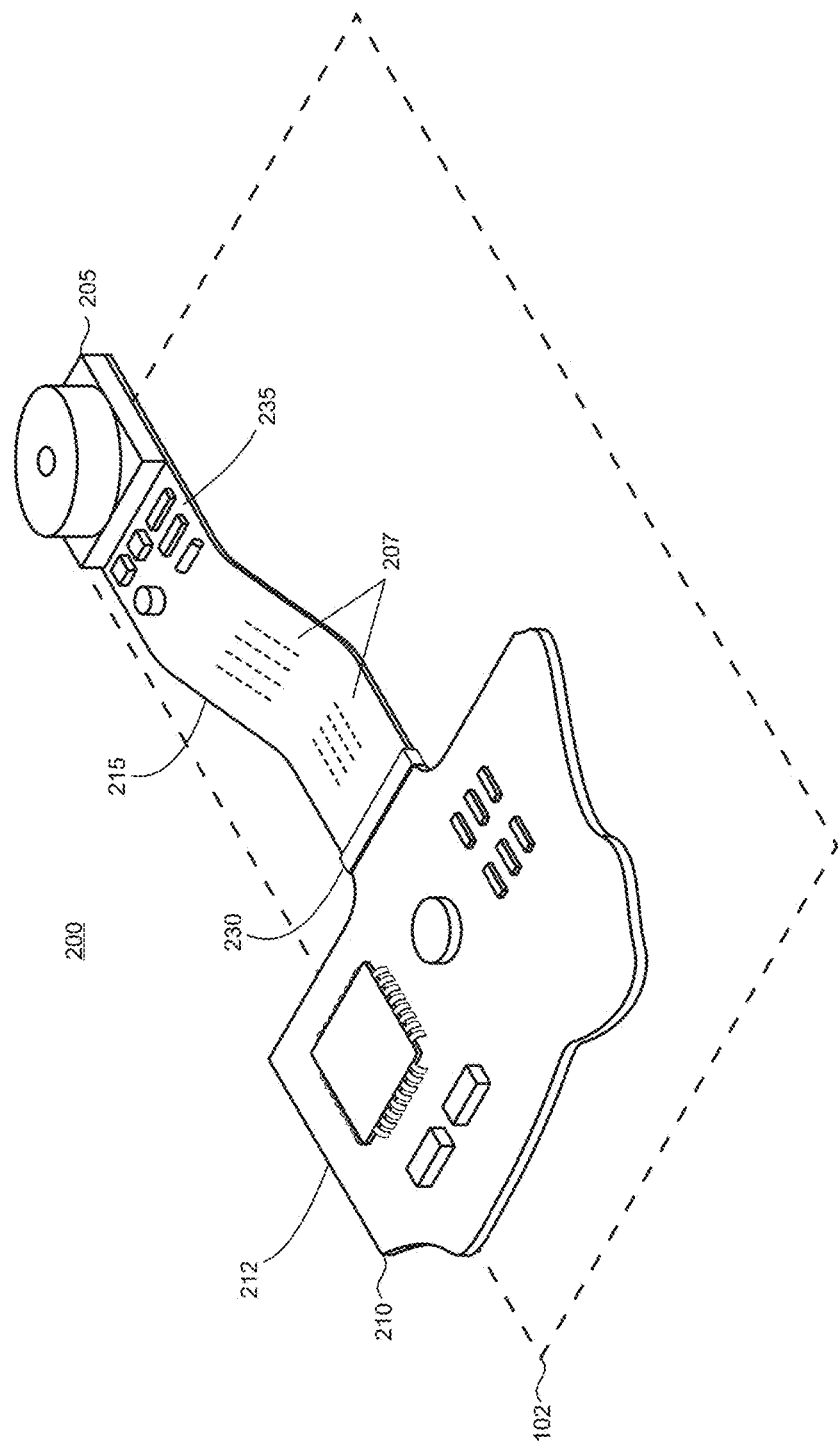
FIG. 2 is a pictorial view of an illustrative image sensor that is operatively coupled to a main circuit board through a flexible printed circuit and connector.

FIG. 2 is a pictorial view of a group 200 of electronic components as illustratively packaged as part of the compact form factor electronic device 102 (it is noted that the pictorial representation is not drawn to scale). The components include an image sensor 205 that is operatively coupled to a main circuit board 210 that includes a processor 212 by a flexible printed circuit 215 and connector 230. Various electronic components and/or circuits 235 can be populated on the flexible printed circuit in some implementations. The image sensor may be implemented as a CMOS (Complementary Metal Oxide Silicon) or CCD (charge coupled device) camera in some cases. The main circuit board 210 supports various components including an application processor that interacts with the image sensor. The main circuit board 210 is a rigid printed circuit board in this particular example, but may also comprise a flexible printed circuit in some implementations.

The flexible printed circuit 215 includes differential signal lines that interconnect and support communication between the image sensor and the main circuit board 210. The support for high-speed differential signaling in the device is one exemplary source of EMI energy. The flexible printed circuit 215 uses a flexible plastic substrate that enables the circuit to assume two- or three-dimensional configurations, as illustratively shown in FIG. 3, and thus can support device packaging geometries that might not be possible with rigid printed circuit boards. Flexible printed circuits may be utilized, for example, as a component of an electronic device such as a head mounted display (HMD) device and other portable electronic devices as respectively shown in FIGS. 10-12 and described in the accompanying text below.

In some cases, a flexible printed circuit may dynamically flex when device components move relative to each other when the device is in use. Flexible printed circuits have lower mass than their rigid counterparts which can provide increased vibration and shock resistance while providing weight savings which may be an important design goal in some implementations.

In general, flexible printed circuits may be configured with conductors that function as wiring structures to enable interconnection of various electronic assemblies utilized in a given device. Representative conductors (which may be used as part of wiring structures in the flexible printed circuits) are depicted using the dashed lines 207 in FIG. 2. Flexible printed circuits may also be configured to support interconnections and circuits among electronic components (e.g., integrated circuits, resistors, capacitors, inductors, and the like) that are populated on the flexible printed circuit in a similar manner as with rigid printed circuit boards. In some cases, as illustratively shown in FIG. 2, flexible printed circuits may support a combination of wiring structures 207 and component/circuits 235.

Figure 3:
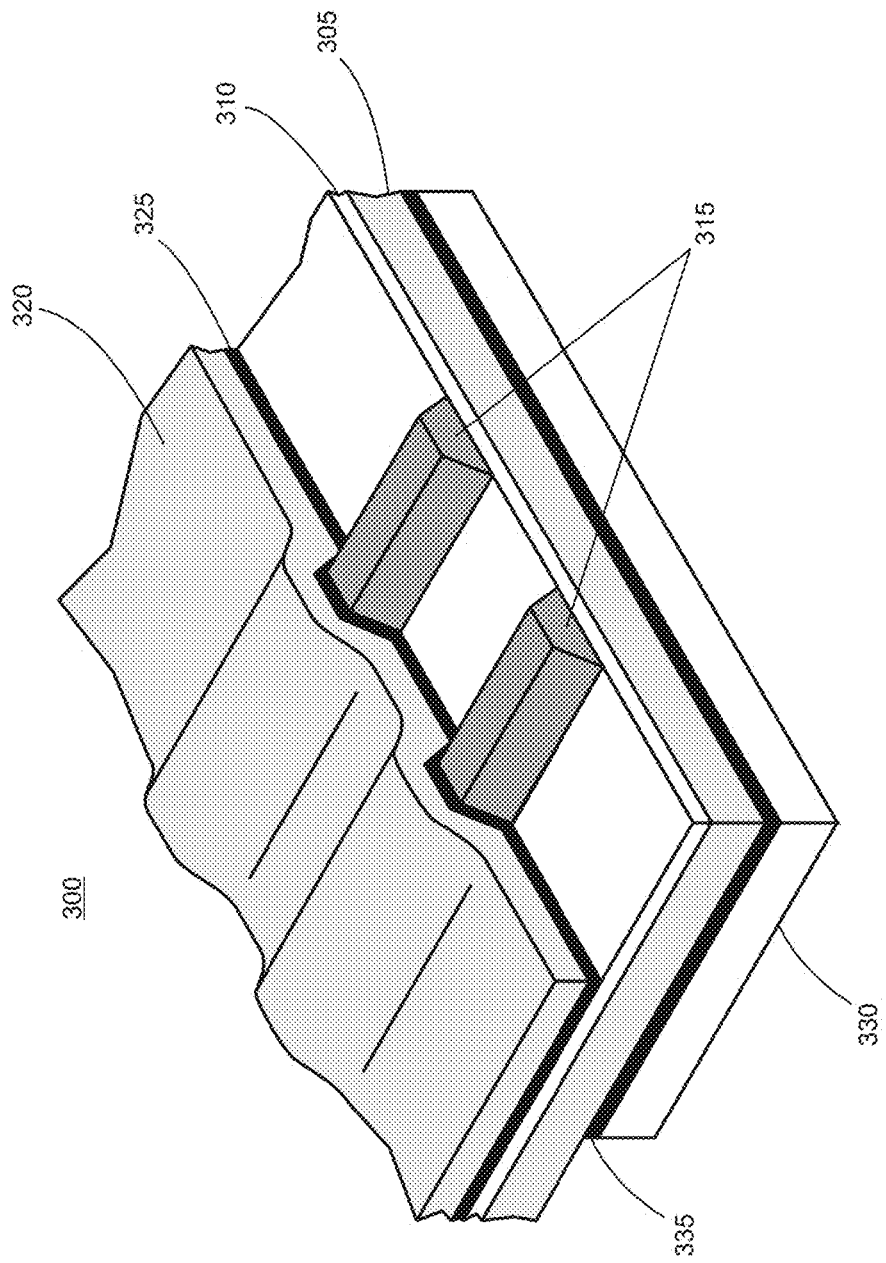
FIG. 3 shows a partial cutaway view of a portion of an illustrative single-layer flexible printed circuit.

FIG. 3 shows a partial cutaway view of a portion of an illustrative single-layer flexible printed circuit 300. A flexible polymer dielectric substrate 305, such as a polyimide (PI) or polyester (PE) film, uses an acrylic or epoxy adhesive layer 310 to adhere a conductive copper layer that is etched to create conductors 315. A PI coverlay 320 is laminated using a pressure-sensitive or thermosetting adhesive 325 over the etched copper to insulate the conductors and function as a solder resist for the flexible printed circuit. In some applications, the coverlay can be applied to the flexible printed circuit as a coating that does not use lamination or adhesive.

In some applications, a stiffener 330 may be applied to various portions of the flexible printed circuit 300 with a pressure-sensitive or thermosetting adhesive 335. The stiffener can be formed from a glass-reinforced epoxy sheet comprising glass woven fabric impregnated with an epoxy resin binder. The stiffener functions to rigidize a portion of the flexible printed circuit. Such rigidizing may be useful, for example, to support surface mounted electronic components, protect solder joints and other connections, provide reinforcement in high stress areas such as bends, and aid in heat dissipation.

Figure 4:
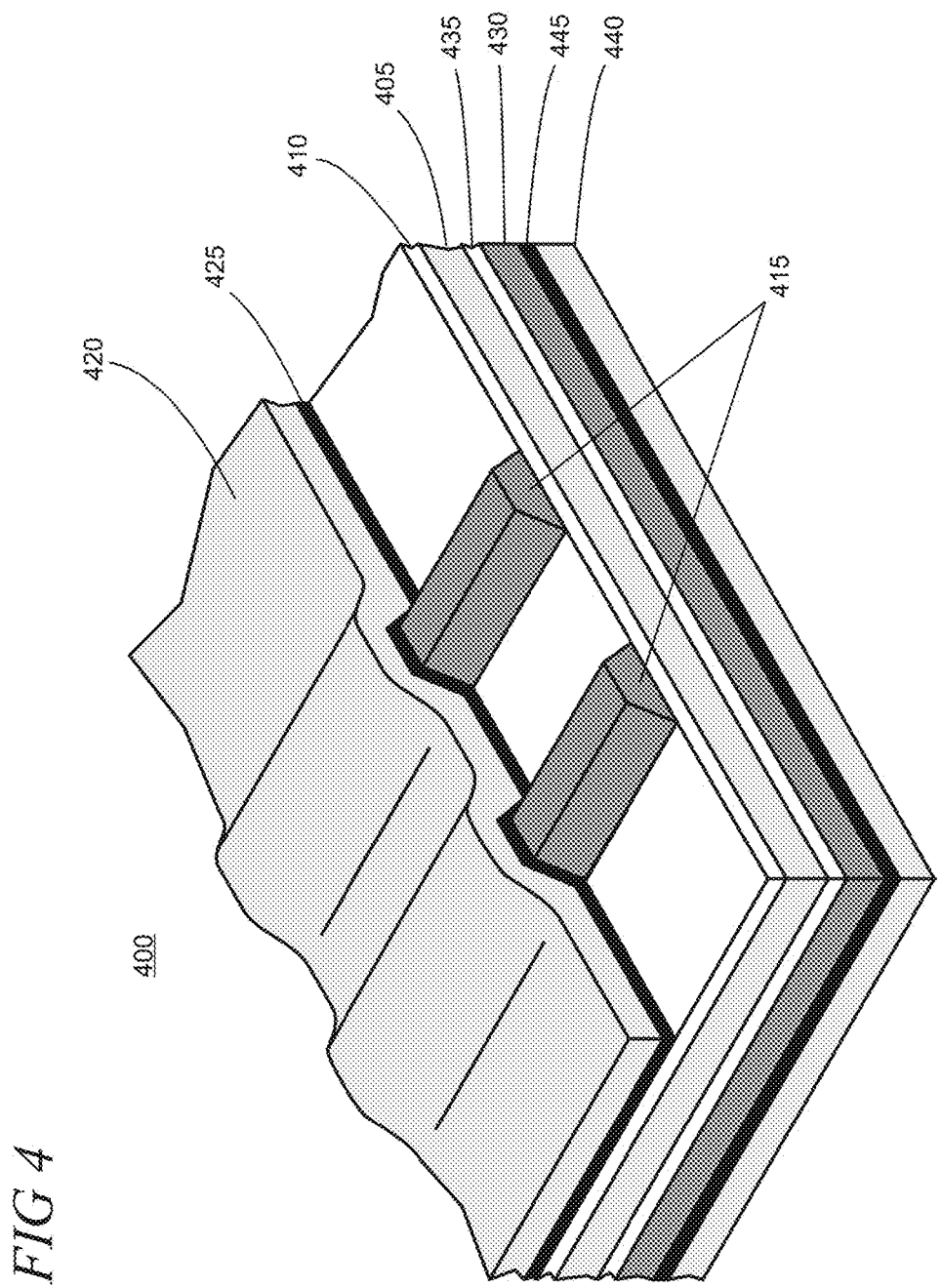
FIG. 4 shows a partial cutaway view of a portion of an illustrative double-layer flexible printed circuit.
Figure 8:
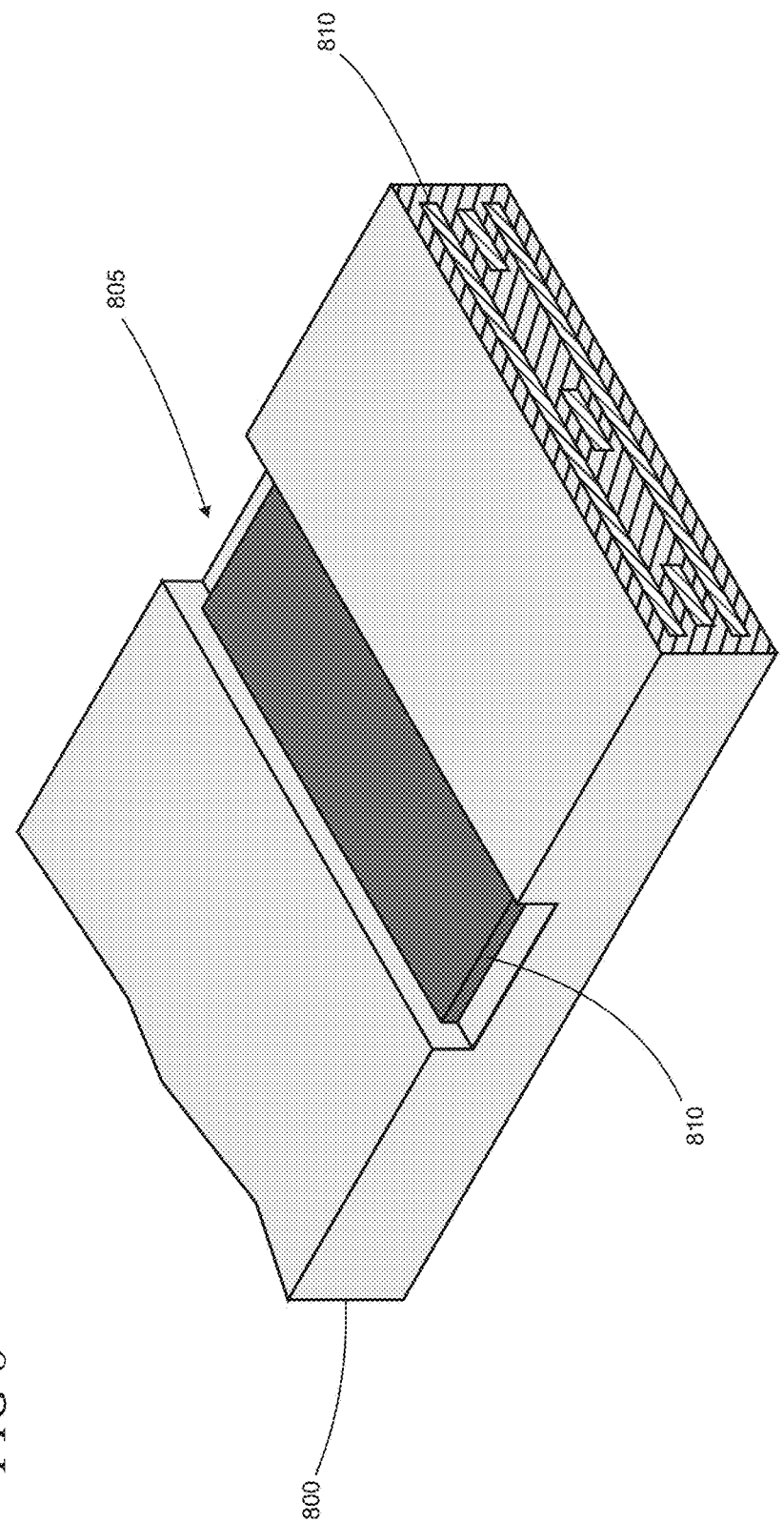
FIGS. 8, 9, and 10 show pictorial views of illustrative coverlay openings in flexible printed circuits.
Figure 9:
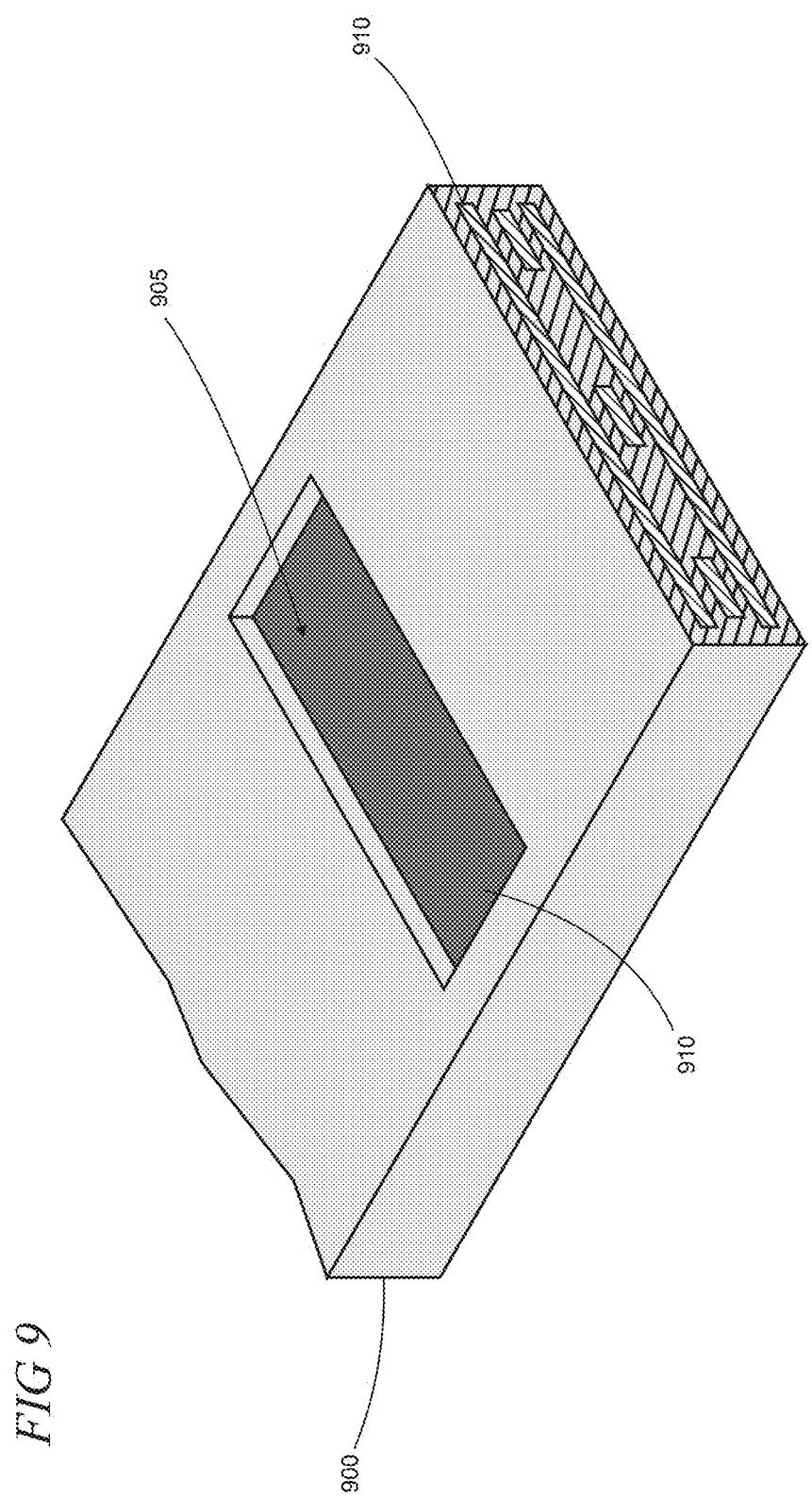
Figure 10:
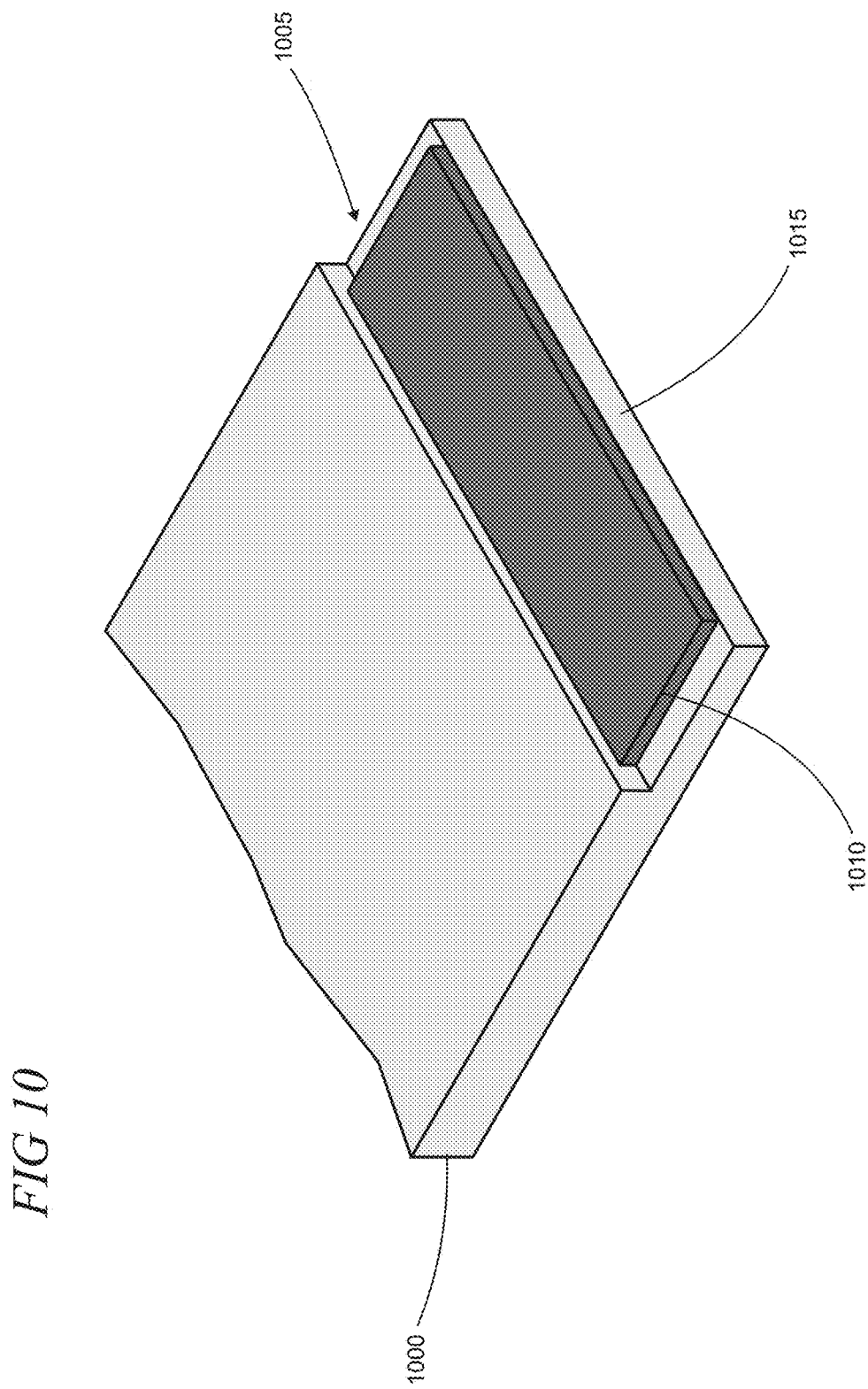

FIG. 4 shows a partial cutaway view of a portion of an illustrative double-layer flexible printed circuit 400. A flexible polymer dielectric substrate 405 uses an adhesive layer 410 to adhere a conductive copper layer that is etched to create conductors 415. API coverlay 420 is laminated over the etched copper with adhesive 425. Another copper layer functions as a ground plane 430 that is adhered to the substrate 405 with adhesive 435. A PI coverlay 440 is laminated over the ground plane 430 with adhesive 445. The coverlay 440 may be configured with openings as shown in FIGS. 8, 9, and 10 and described in the accompanying text below. The ground plane 430 may be configured as a solid ground plane and/or include a crosshatching configuration in some implementations to facilitate, for example, flexibility that meets particular design criteria.

Figure 5:
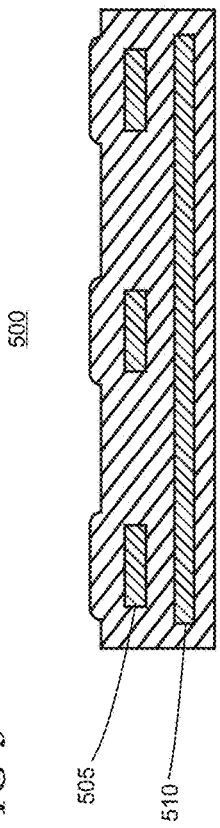
FIGS. 5, 6, and 7 show cross-sectional views of illustrative multi-layer flexible printed circuits.
Figure 6:
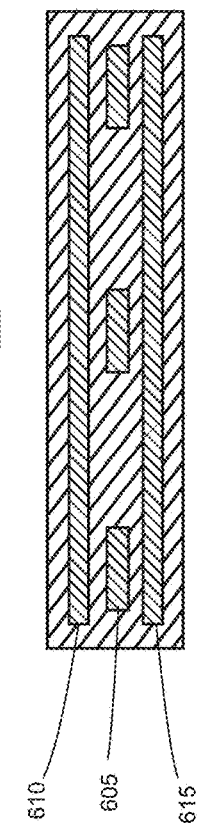
Figure 7:
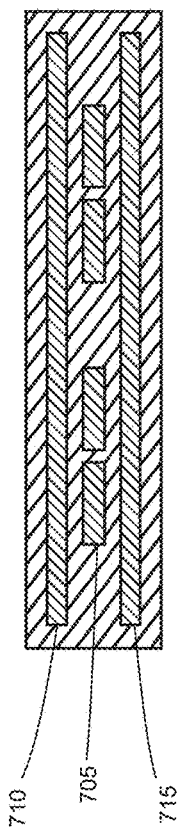

FIGS. 5, 6, and 7 show respective cross-sectional views of illustrative multi-layer flexible printed circuits 500, 600, and 700 (depictions of the various layers are omitted for sake of clarity). Flexible printed circuit 500 in FIG. 5 is a double layer flexible printed circuit that includes circuit traces 505 and a ground plane 510. Flexible printed circuit 600 in FIG. 6 includes three conductive layers configured as an inner layer 605 of circuit traces and two outer ground plane layers 610 and 615. The flexible printed circuit 700 in FIG. 7 includes three conductive layers (circuit traces 705 with outer ground planes 710 and 715) configured in a similar arrangement to that in flexible printed circuit 600 (FIG. 6), except that circuit traces 705 are grouped as differential pairs.

The present flexible printed circuit utilizes openings in the coverlay that expose the ground plane to enable enhanced connectivity between the ground plane and grounded elements in the electronic device. FIGS. 8, 9, and 10 show respective pictorial views of various illustrative configurations that may be utilized for the coverlay openings in flexible printed circuits. In the flexible printed circuit 800 in FIG. 8, an opening 805 exposes an outer ground plane 810 from edge to edge. In the flexible printed circuit 900 in FIG. 9, the opening 905 exposes a portion of an outer ground plane 910, but not across the extent of the conductor's edges. In both flexible printed circuits 800 and 900, the openings are located in a configuration in which the flexible printed circuit extends away in both longitudinal directions from the opening. In the flexible printed circuit 1000 in FIG. 10, the opening 1005 exposes the ground plane 1010 along an end 1015 of the circuit. While each of the illustrative openings in FIGS. 8, 9, and 10 are depicted as rectangular, any of a variety of opening shapes and configurations may be used to meet the needs of a particular implementation.

Figure 11:
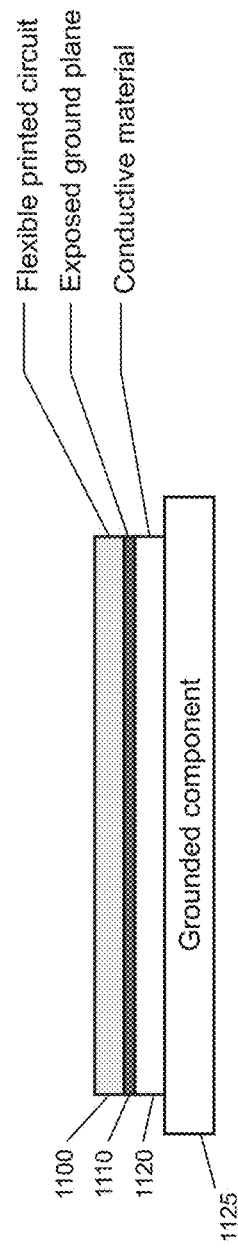
FIG. 11 shows a schematic diagram of a ground plane in an illustrative flexible printed circuit being electrically coupled with conductive material to a grounded component in an electronic device.

FIG. 11 shows a schematic diagram of a ground plane 1110 in an illustrative flexible printed circuit 1100 as electrically coupled with conductive material 1120 to a grounded component 1125 in an electronic device such as a small form factor electronic device. The ground provides a zero potential reference for electronics and circuits operating in the device. Various components singly and, in combination as systems, can provide ground connectivity as the grounded component to the flexible printed circuit, as described in more detail below. For example, the grounded component can be part of, or electrically coupled to a device-wide or system ground such as a chassis ground or similar ground.

The conductive material 1120 can comprise materials such as conductive foam or adhesive. Conductive foams typically comprise a woven polyester mesh that is metallized using, for example, nickel and/or copper. Non-woven fabrics may also be utilized and acrylic conductive adhesive can be pre-applied to the one or more surfaces. Conductive adhesives typically comprise single or multi-part compounds that include a carrier (e.g., acrylic, silicate, polymer, elastomer, resin, epoxy, and the like) and conductive fill materials such as graphite, nickel, and/or silver. Alternative conductive materials such as conductive paints, pastes, coatings, inks, and greases can also be utilized, alone or in combination.

Figure 12:
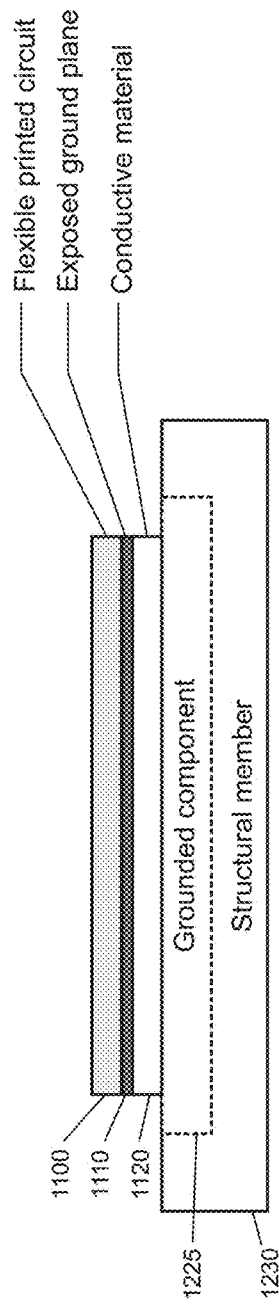
FIG. 12 shows a schematic diagram of a ground plane in an illustrative flexible printed circuit being electrically coupled to a grounded element with a conductive material, in which the grounded component is incorporated in a structural member of an electronic device.

In some implementations, for example as shown in the schematic diagram in FIG. 12, a grounded component 1225 (to which the exposed ground plane 1110 is electrically coupled via the conductive material 1120) may be incorporated into a structural member 1230 of an electronic device. Such configuration can enable configuration of the grounded component to provide ground connectivity to flexible printed circuits while also performing another function in the device in some implementations. Thus, for example and without limitation, structural members can take various suitable configurations including one or more of housing, enclosure, frame, fastener, boss, tab, stud, plate, bus, shield, cowling, flange, duct, cover, rib, stiffener, grounded surface, electrically conductive feature, hardware, architecture, or other mechanical structure, component, feature, or element.

In addition to being parts of structural members, grounded components may also be incorporated into a functional element of an electronic device. For example, the schematic diagram in FIG. 13 shows a grounded component 1325 incorporated into an electrical return path 1330 that is utilized by a battery 1335 in the electronic device. The schematic diagram in FIG. 14 shows a grounded component 1425 incorporated into a thermal management system 1430 that is configured to dissipate heat generated by various heat-producing elements 1435 in the electronic device.

Figure 15:
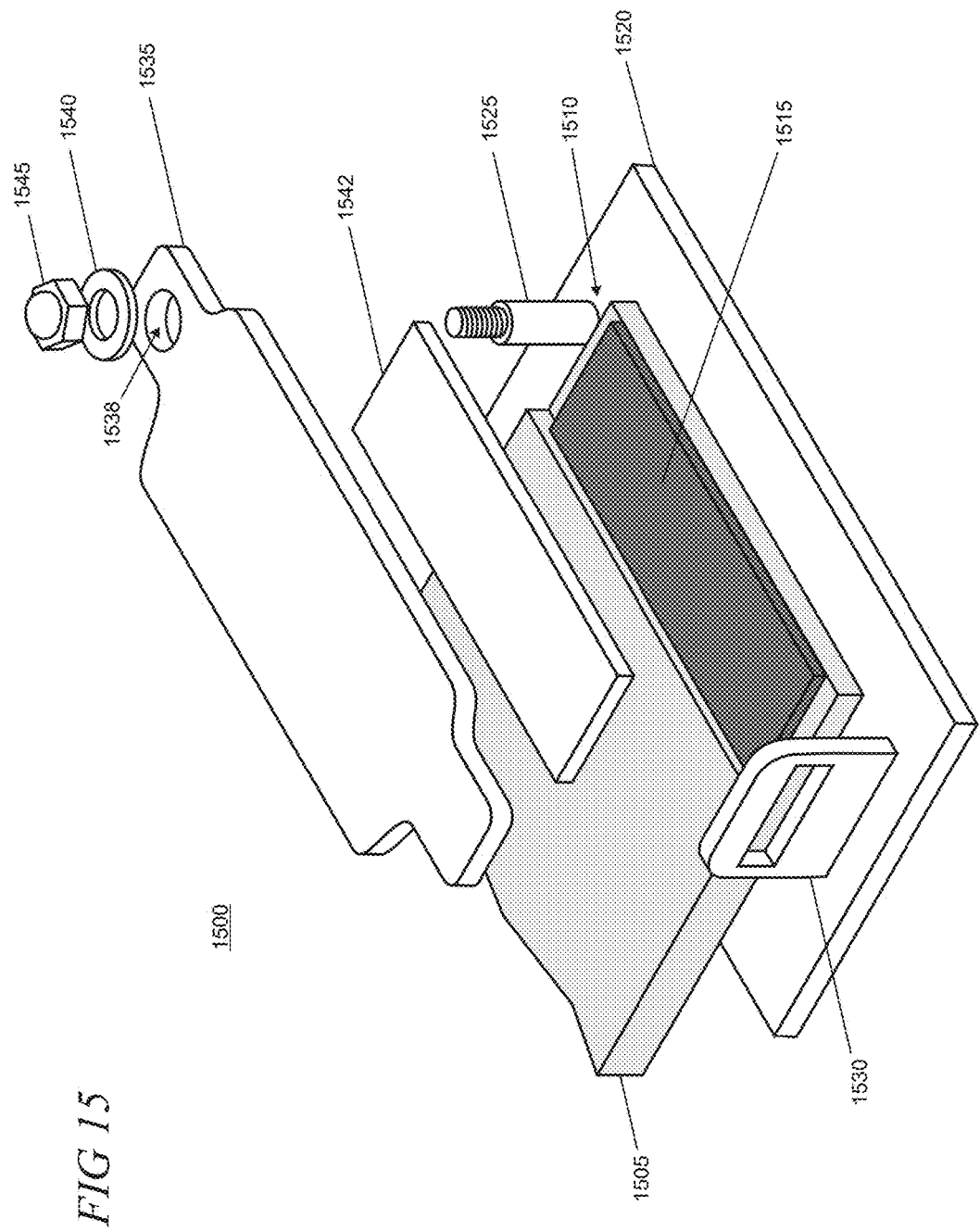
FIG. 15 shows an exploded view of an illustrative embodiment of a flexible printed circuit sub-assembly that may be used in an electronic device.

FIG. 15 shows an exploded view of one particular illustrative embodiment of a flexible printed circuit sub-assembly 1500 that may be used in an electronic device. A flexible printed circuit 1505 includes an end that has an opening 1510 in the coverlay that exposes a portion of a ground plane 1515. The flexible printed circuit 1505 is received by a suitably configured area 1520 of the electronic device. For example, the flexible circuit receiving area 1520 may be a part of the device housing, an internal structure of the device, or other suitable structure, feature, or element. The receiving area 1520 includes a threaded post 1525 and slotted tab 1530 which project from the surface. Hardware including a washer 1540 or gasket and nut 1545 engage with the post 1525 when the sub-assembly 1500 is assembled. A cowling 1535 includes a projection 1650 that is configured to engage with the slotted tab 1530 and a hole for receiving a threaded post when the sub-assembly 1500 is assembled as shown in FIG. 16. The cowling 1535 is a grounded metallic component, in this illustrative example, that functions as a structural element in the electronic device separately from its role as a grounded component that provides electrical continuity with a piece of conductive foam 1542 and the ground plane 1515 that is exposed by the opening in the coverlay in the flexible printed circuit 1505. FIG. 17 shows a front view of the sub-assembly 1500, as assembled.

In some implementations, the grounded component can be implemented for ground plane continuity without significant modification to its configuration to fulfill its role as a structural element or functional element. In other implementations, some design modifications or tweaks may be implemented. For example, fastener hardware may be specified to have surfaces that enhance conductivity when performing double duty as both fastener and grounded component. In yet other implementations, a designer may specifically configure a grounded component for performing both roles to achieve a particular balance of design goals or objectives.

Figure 18:
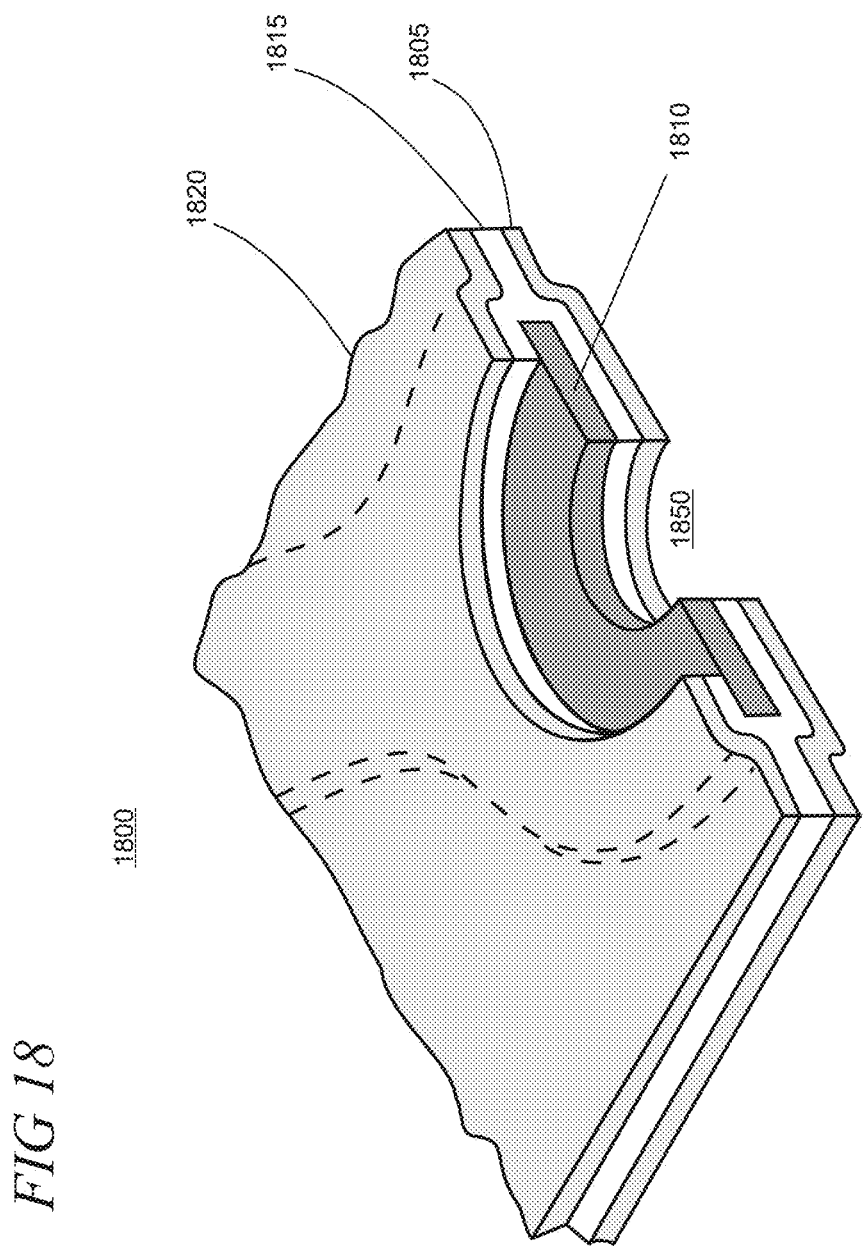
FIG. 18 shows a cross-sectional view of a portion of an illustrative single-layer flexible printed circuit with a through-hole.

The following text describes additional flexible printed circuit configurations that may be utilized in various implementations of the present flexible printed circuit with enhanced ground plane connectivity. For example, flexible printed circuits may be configured to support either or both surface mount and through-hole/leaded electronic components. As shown in the cross-sectional view of a portion of an illustrative flexible printed circuit 1800 in FIG. 18, the conductor 1810 includes a drilled hole 1850 (in which the hole is typically drilled prior to etching) and the coverlay 1820 is configured with a corresponding opening to enable access to the conductor 1810. In FIG. 18, the reference numeral 1805 indicates the polymer substrate and reference numeral 1815 indicates the acrylic adhesive.

Figure 19:
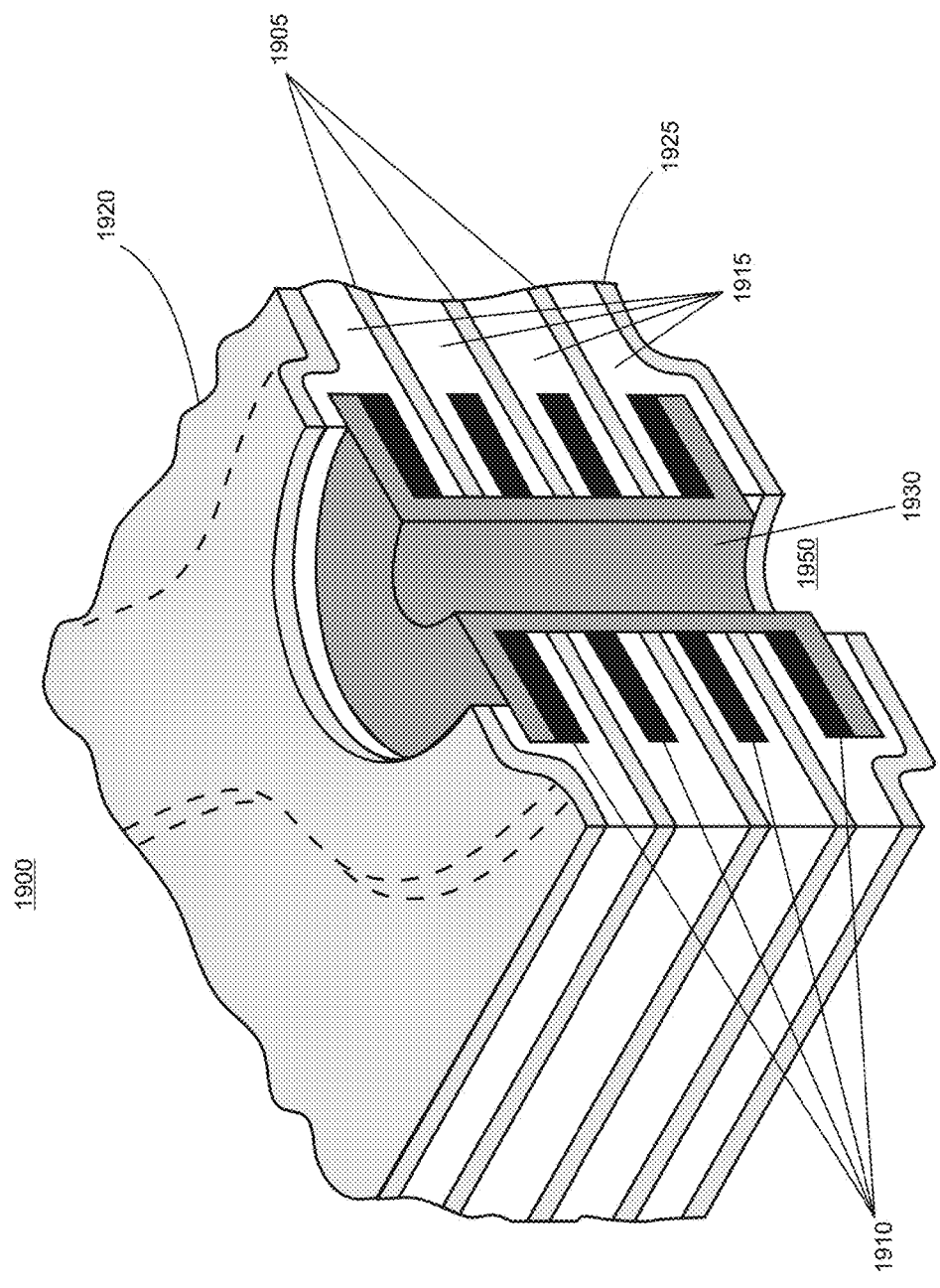
FIG. 19 shows a cross-sectional view of a portion of an illustrative multi-layer flexible printed circuit with a plated through-hole.

FIG. 18 illustrates a single-layer flexible printed circuit. However, as with rigid printed circuits, flexible printed circuits may be configured with multiple layers of conductors, i.e., 2, 3, or more separate flexible conductive layers with flexible dielectric layers between each. For example, FIG. 19 shows a cross-sectional view of a portion of an illustrative flexible printed circuit 1900 with four layers of conductors 1910 that are separated by flexible dielectric layers 1905 (e.g., PI or PE film), and adhesive layers 1915. Outer coverlays 1920 and 1925, having openings, are laminated to the top and bottom of the flexible printed circuit.

In this particular example, the through-hole 1950 is copper plated, as indicated by reference numeral 1930 to provide an electrical connection between the conductor layers. Non-plated through-holes and/or plated through vias may also be utilized in a given flexible printed circuit. A blind via connects an outer layer with the adjacent inner layer, but does not go all the way through the circuit. Buried vias connect internal layers, but do not connect to the outer layers. Other electrical and structural features (e.g., pins, connectors, bosses, etc.) may also be incorporated into a flexible printed circuit in some cases.

Figure 20:
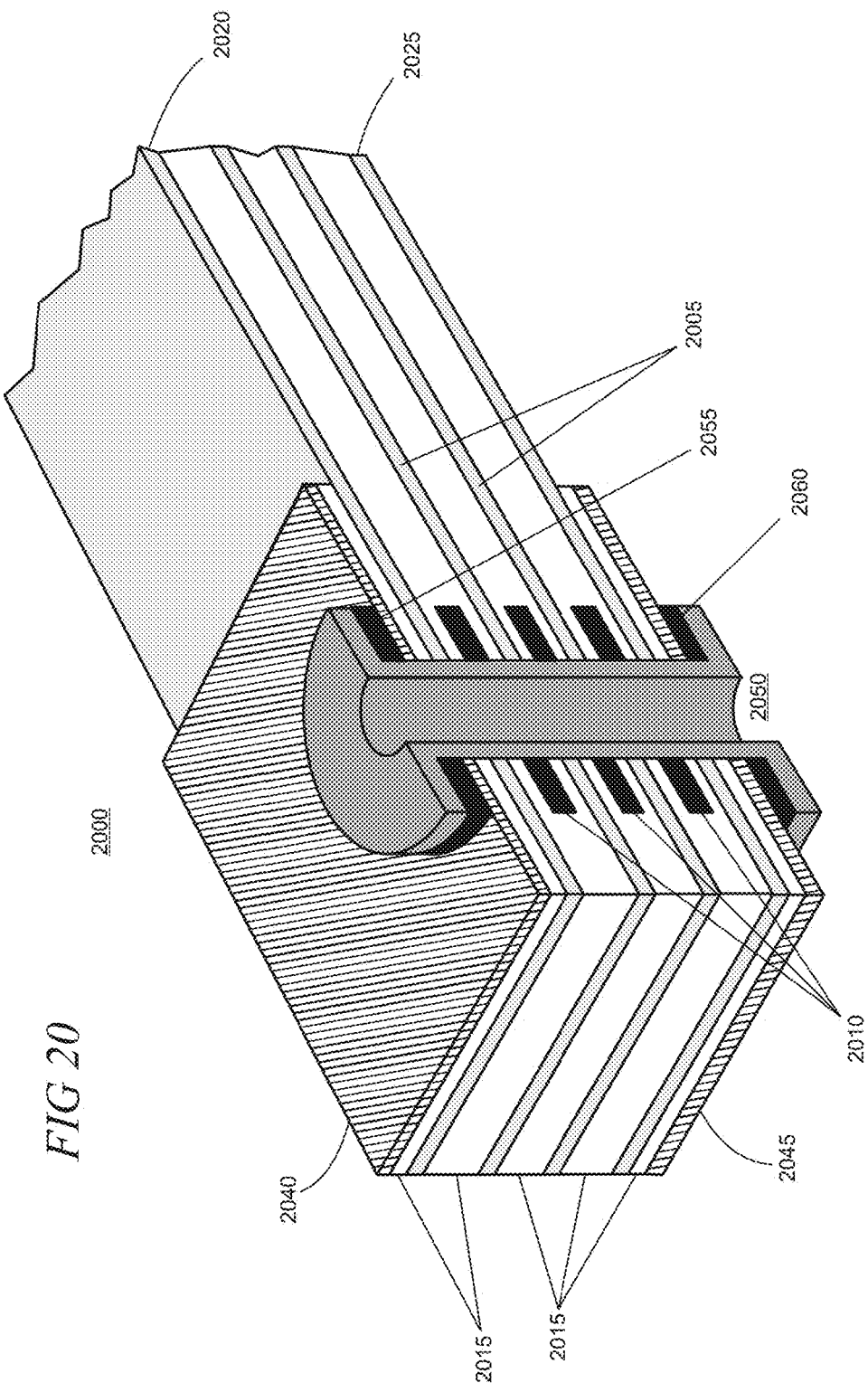
FIG. 20 shows a cross-sectional view of a portion of an illustrative rigid-flex printed circuit.

Hybrid constructions of rigid and flexible printed circuits may also be utilized with the present flexible printed circuit with enhanced ground plane connectivity. For example, FIG. 20 shows a cross-sectional view of a portion of an illustrative rigid-flex printed circuit 2000. The rigid-flex printed circuit includes multiple layers of flexible conductors, dielectric material, and adhesive (respectively indicated by reference numerals 2010, 2005, and 2015) in a similar manner as the flexible printed circuit 1900 (FIG. 19). Coverlays 2020 and 2025 are also utilized, as shown. In addition, rigid layers 2040 and 2045 such as glass-reinforced epoxy sheets are attached to the flexible portion of the rigid-flex printed circuit with adhesive. Unlike the stiffener 330 (FIG. 3), the rigid layers support conductors, as respectively indicated by reference numerals 2055 and 2060. In this particular example, a plated through-hole 2050 electrically couples the respective conductor layers together.

Figure 21:
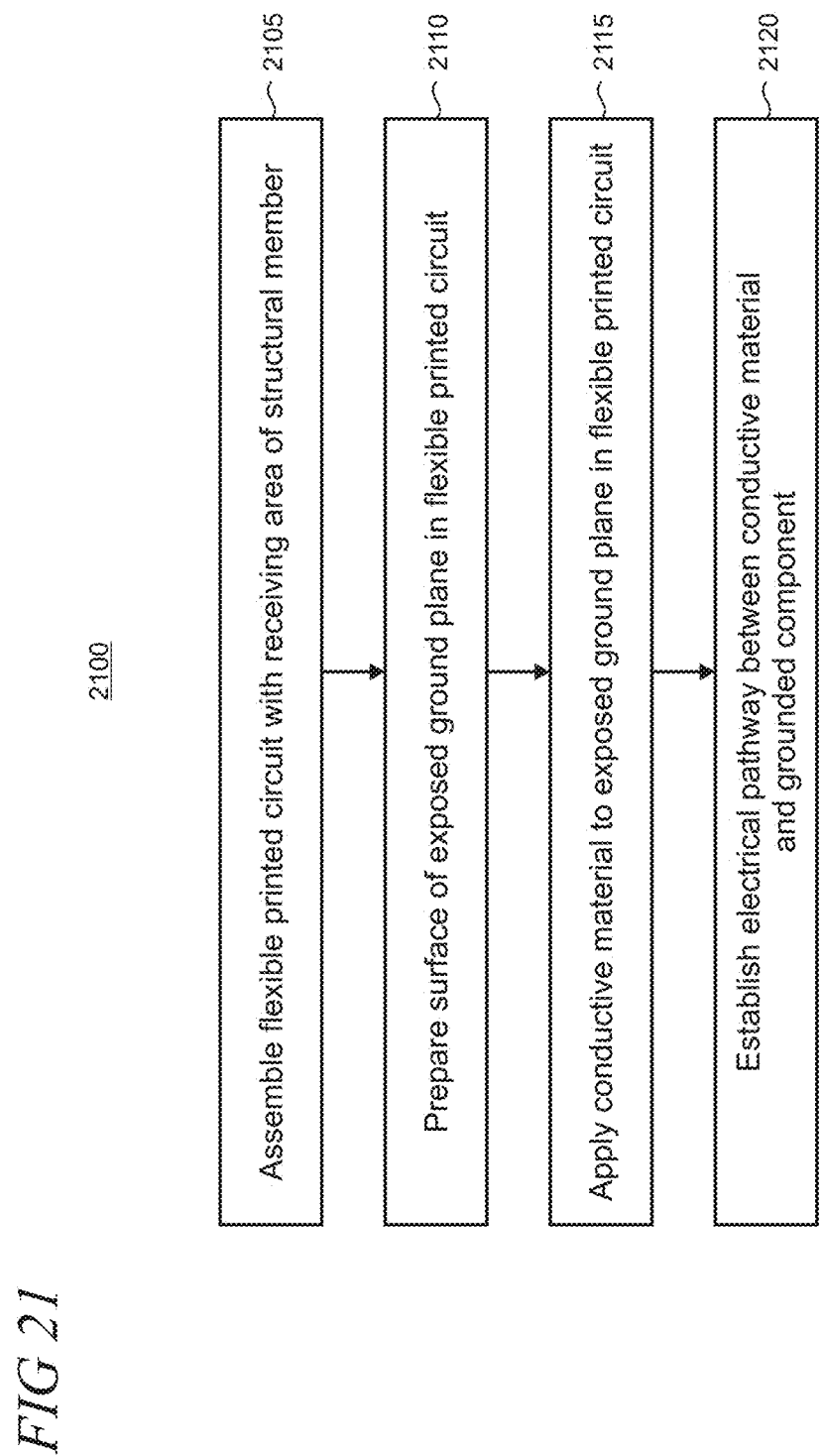
FIG. 21 is a flowchart of an illustrative method for assembling a flexible printed circuit in a sub-assembly that may be used in an electronic device.

FIG. 21 is a flowchart of an illustrative method 2100 for assembling a flexible printed circuit in a sub-assembly that may be used in an electronic device. Unless specifically stated, the methods or steps shown in the flowchart and described in the accompanying text are not constrained to a particular order or sequence. In addition, some of the methods or steps thereof can occur or be performed concurrently and not all the methods or steps have to be performed in a given implementation depending on the requirements of such implementation and some methods or steps may be optionally utilized.

In step 2105, the flexible printed circuit is assembled with a receiving area of a structural member in an electronic device. The flexible printed circuit is configured to have one or more openings that expose one or more ground planes. In step 2110, surfaces of the exposed ground planes can be prepared. For example, in some implementations, areas of exposed ground plane can be cleaned, abraded, or otherwise prepared to enhance connectivity with conductive material such as conductive foam or adhesive. In some cases, the exposed ground planes may be configured for enhanced connectivity at the point of manufacture of the flexible printed circuit, for example, by omitting anodizing, blackening, or other surface treatments that may otherwise be utilized for corrosion prevention or other reasons, but which may increase electrical resistance beyond an acceptable level at the interface between the conductive material and exposed ground plane.

In step 2115, the conductive material is applied to the exposed ground plane. In step 2120, an electrical pathway is established between the conductive material and a grounded component in the electronic device so that a ground loop is created for the flexible printed circuit which may be used to shunt EMI energy when the device is operated.

The present flexible printed circuit with enhanced ground plane connectivity may be incorporated into one or more systems that are utilized in a virtual or mixed reality display device. Such device may take any suitable form, including but not limited to near-eye devices such as an HMD device. A see-through display may be used in some implementations while an opaque (i.e., non-see-through) display using a camera-based pass-through or outward facing sensor, for example, may be used in other implementations.

Figure 22:
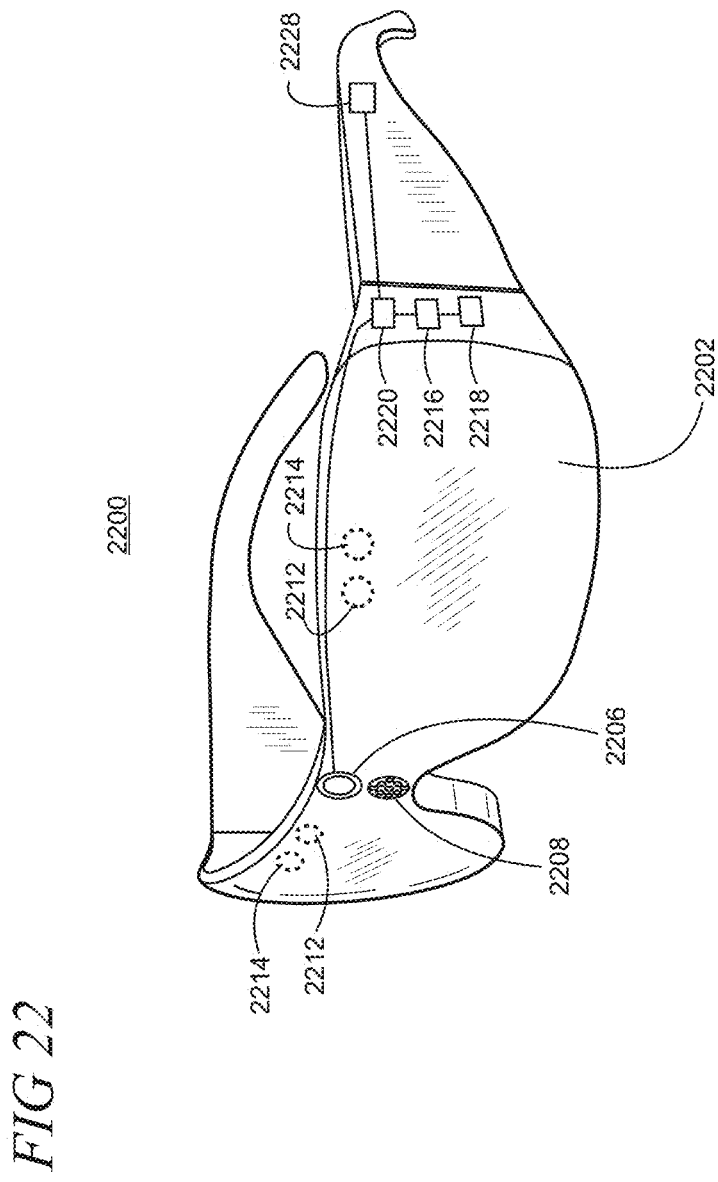
FIG. 22 is a pictorial view of an illustrative example of a virtual reality or augmented reality head mounted display (HMD) device.
Figure 23:
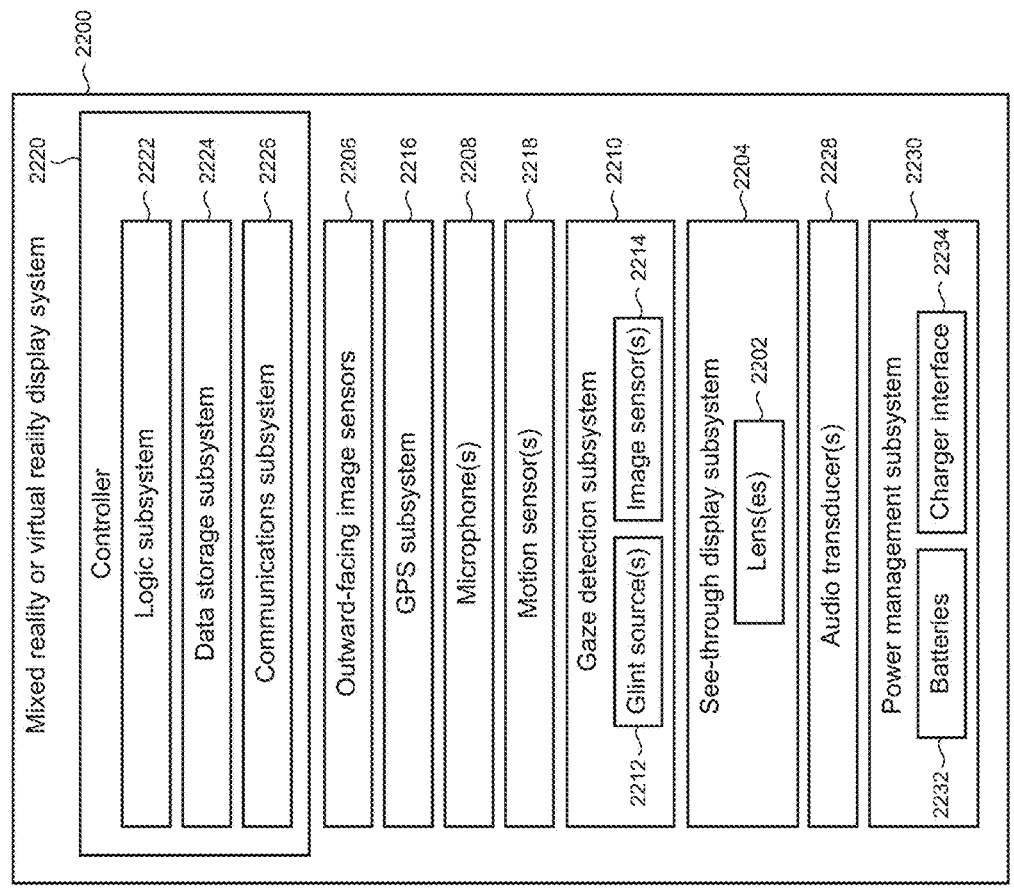
FIG. 23 shows a block diagram of an illustrative example of a virtual reality or augmented reality HMD device.

FIG. 22 shows one particular illustrative example of a see-through, augmented reality or virtual reality display system 2200, and FIG. 23 shows a functional block diagram of the system 2200. Display system 2200 comprises one or more lenses 2202 that form a part of a see-through display subsystem 2204, such that images may be displayed using lenses 2202 (e.g. using projection onto lenses 2202, one or more waveguide systems incorporated into the lenses 2202, and/or in any other suitable manner). Display system 2200 further comprises one or more outward-facing image sensors 2206 configured to acquire images of a background scene and/or physical environment being viewed by a user, and may include one or more microphones 2208 configured to detect sounds, such as voice commands from a user. Outward-facing image sensors 2206 may include one or more depth sensors and/or one or more two-dimensional image sensors. In alternative arrangements, as noted above, an augmented reality or virtual reality display system, instead of incorporating a see-through display subsystem, may display augmented reality or virtual reality images through a viewfinder mode for an outward-facing image sensor.

The display system 2200 may further include a gaze detection subsystem 2210 configured for detecting a direction of gaze of each eye of a user or a direction or location of focus, as described above. Gaze detection subsystem 2210 may be configured to determine gaze directions of each of a user's eyes in any suitable manner. For example, in the illustrative example shown, a gaze detection subsystem 2210 includes one or more glint sources 2212, such as infrared light sources, that are configured to cause a glint of light to reflect from each eyeball of a user, and one or more image sensors 2214, such as inward-facing sensors, that are configured to capture an image of each eyeball of the user. Changes in the glints from the user's eyeballs and/or a location of a user's pupil, as determined from image data gathered using the image sensor(s) 2214, may be used to determine a direction of gaze.

In addition, a location at which gaze lines projected from the user's eyes intersect the external display may be used to determine an object at which the user is gazing (e.g. a displayed virtual object and/or real background object). Gaze detection subsystem 2210 may have any suitable number and arrangement of light sources and image sensors. In some implementations, the gaze detection subsystem 2210 may be omitted.

The display system 2200 may also include additional sensors. For example, display system 2200 may comprise a global positioning system (GPS) subsystem 2216 to allow a location of the display system 2200 to be determined. This may help to identify real-world objects, such as buildings, etc. that may be located in the user's adjoining physical environment.

The display system 2200 may further include one or more motion sensors 2218 (e.g., inertial, multi-axis gyroscopic, or acceleration sensors) to detect movement and position/ orientation/pose of a user's head when the user is wearing the system as part of an augmented reality or virtual reality HMD device. Motion data may be used, potentially along with eye-tracking glint data and outward-facing image data, for gaze detection, as well as for image stabilization to help correct for blur in images from the outward-facing image sensor(s) 2206. The use of motion data may allow changes in gaze location to be tracked even if image data from outward-facing image sensor(s) 2206 cannot be resolved.

In addition, motion sensors 2218, as well as microphone(s) 2208 and gaze detection subsystem 2210, also may be employed as user input devices, such that a user may interact with the display system 2200 via gestures of the eye, neck and/or head, as well as via verbal commands in some cases. It may be understood that sensors illustrated in FIGS. 22 and 23 and described in the accompanying text are included for the purpose of example and are not intended to be limiting in any manner, as any other suitable sensors and/or combination of sensors may be utilized to meet the needs of a particular implementation. For example, biometric sensors (e.g., for detecting heart and respiration rates, blood pressure, brain activity, body temperature, etc.) or environmental sensors (e.g., for detecting temperature, humidity, elevation, UV (ultraviolet) light levels, etc.) may be utilized in some implementations.

The display system 2200 can further include a controller 2220 having a logic subsystem 2222 and a data storage subsystem 2224 in communication with the sensors, gaze detection subsystem 2210, display subsystem 2204, and/or other components through a communications subsystem 2226. The communications subsystem 2226 can also facilitate the display system being operated in conjunction with remotely located resources, such as processing, storage, power, data, and services. That is, in some implementations, an HMD device can be operated as part of a system that can distribute resources and capabilities among different components and subsystems.

The storage subsystem 2224 may include instructions stored thereon that are executable by logic subsystem 2222, for example, to receive and interpret inputs from the sensors, to identify location and movements of a user, to identify real objects using surface reconstruction and other techniques, and dim/fade the display based on distance to objects so as to enable the objects to be seen by the user, among other tasks.

The display system 2200 is configured with one or more audio transducers 2228 (e.g., speakers, earphones, etc.) so that audio can be utilized as part of an augmented reality or virtual reality experience. A power management subsystem 2230 may include one or more batteries 2232 and/or protection circuit modules (PCMs) and an associated charger interface 2234 and/or remote power interface for supplying power to components in the display system 2200.

It may be appreciated that the display system 2200 is described for the purpose of example, and thus is not meant to be limiting. It may be further understood that the display device may include additional and/or alternative sensors, cameras, microphones, input devices, output devices, etc. than those shown without departing from the scope of the present arrangement. Additionally, the physical configuration of a display device and its various sensors and subcomponents may take a variety of different forms without departing from the scope of the present arrangement.

Figure 24:
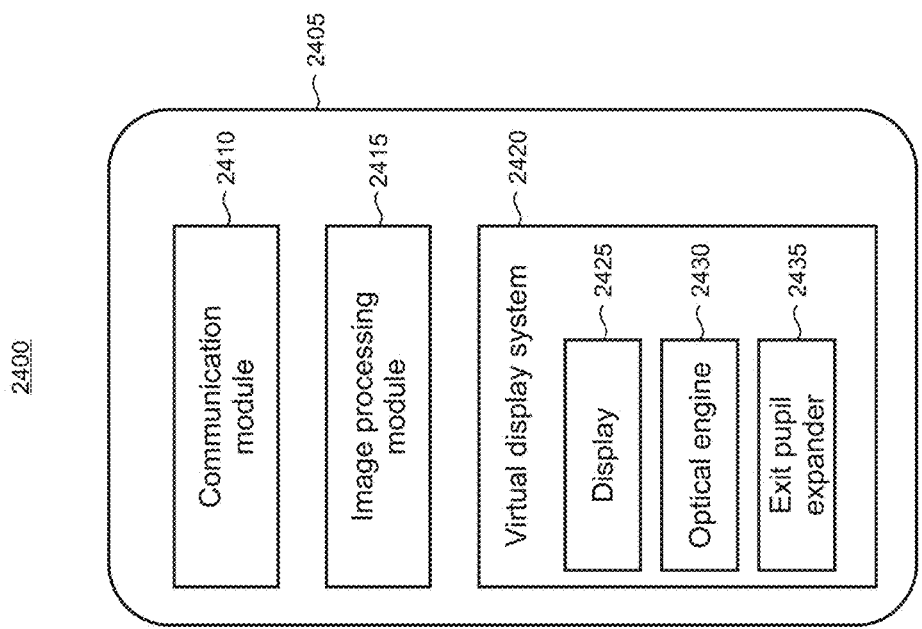
FIG. 24 shows a block diagram of an illustrative electronic device that incorporates an augmented reality or virtual reality display system.

As shown in FIG. 24, an augmented reality or virtual reality display system using the present flexible printed circuit with enhanced ground plane connectivity can be used in a mobile or portable electronic device 2400, such as a mobile phone, smartphone, personal digital assistant (PDA), communicator, portable Internet appliance, hand-held computer, digital video or still camera, wearable computer, computer game device, specialized bring-to-the-eye product for viewing, or other portable electronic device. As shown, the portable device 2400 includes a housing 2405 to house a communication module 2410 for receiving and transmitting information from and to an external device, or a remote system or service (not shown).

The portable device 2400 may also include an image processing module 2415 for handling the received and transmitted information, and a virtual display system 2420 to support viewing of images. The virtual display system 2420 can include a micro-display or an imager 2425 and an optical engine 2430. The image processing module 2415 may be operatively connected to the optical engine 2430 to provide image data, such as video data, to the imager 2425 to display an image thereon. An exit pupil expander (EPE) 2435 can be optically linked to an optical engine 2430. The EPE may incorporate or be part of a display system that supports augmented reality or virtual reality images.

The present flexible printed circuit with enhanced ground plane connectivity may also be utilized in an augmented reality or virtual reality display system utilized in non-portable devices, such as gaming devices, multimedia consoles, personal computers, vending machines, smart appliances, Internet-connected devices, and home appliances, such as an oven, microwave oven and other appliances, and other non-portable devices.

Various exemplary embodiments of the present flexible printed circuit with enhanced ground plane connectivity are now presented by way of illustration and not as an exhaustive list of all embodiments. An example includes a compact form factor apparatus, comprising: one or more electrical components that generate electro-magnetic interference (EMI) energy during operation of the compact form factor apparatus; one or more flexible printed circuits at least partially configured as interconnects among the electrical components, the flexible printed circuit comprising a flexible substrate on which circuit traces are disposed, at least one ground plane, and a protective coverlay covering the ground plane; and a grounding system, comprising one or more electrically coupled conducting components, configured to provide a zero reference voltage level for one or more electrical systems in the compact form factor apparatus when operating, wherein each of the one or more flexible printed circuits includes at least one opening in the coverlay that exposes a portion of the ground plane and the exposed portion is electrically coupled to the grounding system so as to create a plurality of ground loops in the flexible printed circuits for shunting EMI energy during operation of the compact form factor apparatus.

In another example, the coverlay openings are configured in number and location on the one or more flexible printed circuits to minimize ground loop length. In another example, the grounding system incorporates a structural member or a functional feature of the compact form factor apparatus. In another example, the exposed portion of the ground plane is grounded to the grounding system using one or more of conductive adhesive or conductive foam. In another example, the exposed portion of the ground plane is configured to optimize conductivity with the conductive adhesive or conductive foam. In another example, the optimization includes omitting one or more of blackened layer, anodized layer, or corrosion-resistant treatment on the exposed ground plane. In another example, the optimization includes preparing a surface of the exposed ground plane to increase adhesion strength between the exposed ground plane and the conductive foam or conductive adhesive. In another example, the compact form factor apparatus is embodied in a head mounted display device wherein at least one of the electrical components comprises an image sensor that operates using high-speed differential signaling.

A further example includes an electronic device, comprising: at least one processor; a main circuit board on which the processor is mounted; one or more peripheral electronic components; one or more flexible printed circuits, each flexible printed circuit comprising circuit traces disposed on a flexible substrate and at least one ground plane, the flexible printed circuits configured to operatively couple the peripheral electronic components over the circuit traces to the main circuit board; at least one structural member with which at least one of the main circuit board, peripheral components, or flexible printed circuits is disposed; and a grounded conductor, wherein at least one of the flexible printed circuits is configured with at least a partially exposed ground plane and the exposed ground plane is electrically coupled to the grounded conductor over an electrical pathway that includes conductive foam or conductive adhesive.

In another example, the grounded conductor is incorporated in the structural member of the electronic device. In another example, the structural member includes one of housing, enclosure, frame, fastener, boss, tab, stud, plate, bus, shield, cowling, flange, duct, cover, rib, stiffener, grounded surface, electrically conductive feature, hardware, or architecture. In another example, the grounded conductor is configured as a return electrical pathway for the battery. In another example, the electronic device further includes a thermal management system comprising a metallic component configured to dissipate thermal energy generated during operation of the electronic device and in which the grounded conductor is incorporated into at least a portion of the metallic component. In another example, the electronic device further includes an electro-magnetic interference (EMI) shielding system comprising one or more EMI shields and in which the grounded conductor is incorporated into at least a portion of an EMI shield. In another example, the ground plane in each flexible printed circuit, the electrical pathway, and the grounded conductor form a ground loop and wherein coverlay openings are located in the electronic device to expose the ground planes so as to minimize the ground loop length.

A further examples includes a method of assembling a sub-assembly that includes a flexible printed circuit and a structural member of an electronic device, the method comprising: assembling at least a portion of the flexible printed circuit with a receiving area of the structural member that is configured to receive the portion of the flexible printed circuit, wherein the flexible printed circuit includes a ground plane that is at least partially exposed, and wherein the structural member includes an electrically conductive component that is at ground potential for the electronic device when the electronic device is operated; applying a conductive material to the exposed ground plane in the flexible printed circuit; and establishing an electrical pathway between the conductive material and the ground potential component so that the ground plane of the flexible printed circuit is grounded when the electronic device is operated.

In another example, the flexible printed circuit includes a coverlay and the ground plane is at least partially exposed through an opening in the coverlay. In another example, the conductive material is one of conductive foam, conductive adhesive, combination of conductive foam and conductive adhesive, solder, conductive ink, conductive paint, conductive grease, conductive paste, or conductive coating. In another example, the method further includes preparing a surface of the exposed ground plane in the flexible printed circuit prior to applying the conductive material. In another example, the preparation includes one of cleaning or abrasion.

The subject matter described above is provided by way of illustration only and should not be construed as limiting. Various modifications and changes may be made to the subject matter described herein without following the example embodiments and applications illustrated and described, and without departing from the true spirit and scope of the present invention, which is set forth in the following claims.

What is claimed is:

1. A compact form factor apparatus, comprising:
   one or more electrical components that generate electromagnetic interference (EMI) energy during operation of the compact form factor apparatus;
   one or more flexible printed circuits at least partially configured as interconnects among the electrical components, the flexible printed circuit comprising a flexible substrate on which circuit traces are disposed, at least one ground plane, and a protective coverlay covering the ground plane; and
   a grounding system, comprising one or more electrically coupled conducting components, configured to provide a zero reference voltage level for one or more electrical systems in the compact form factor apparatus when operating,
   wherein each of the one or more flexible printed circuits includes at least one opening in the coverlay that is formed along an end of the one or more flexible printed circuits, and wherein the coverlay exposes a portion of the ground plane and the exposed portion is electrically coupled to the grounding system so as to create a plurality of ground loops in the flexible printed circuits for shunting EMI energy during operation of the compact form factor apparatus.

2. The compact form factor apparatus of claim 1 in which the coverlay openings are configured in number and location on the one or more flexible printed circuits to minimize ground loop length.

3. The compact form factor apparatus of claim 1 in which the grounding system incorporates a structural member or a functional feature of the compact form factor apparatus.

4. The compact form factor apparatus of claim 1 in which the exposed portion of the ground plane is grounded to the grounding system using one or more of conductive adhesive or conductive foam.

5. The compact form factor apparatus of claim 4 in which the exposed portion of the ground plane is configured to optimize conductivity with the conductive adhesive or conductive foam.

6. The compact form factor apparatus of claim 5 in which the optimization includes omitting one or more of blackened layer, anodized layer, or corrosion-resistant treatment on the exposed ground plane.

7. The compact form factor apparatus of claim 5 in which the optimization includes preparing a surface of the exposed ground plane to increase adhesion strength between the exposed ground plane and the conductive foam or conductive adhesive.

8. The compact form factor apparatus of claim 1 as embodied in a head mounted display device wherein at least one of the electrical components comprises an image sensor that operates using high-speed differential signaling.

9. An electronic device, comprising:
   at least one processor;
   a main circuit board on which the processor is mounted;
   one or more peripheral electronic components;
one or more flexible printed circuits, each flexible printed circuit comprising circuit traces disposed on a flexible substrate and at least one ground plane, the flexible printed circuits configured to operatively couple the peripheral electronic components over the circuit traces to the main circuit board;
at least one structural member with which at least one of the main circuit board, peripheral components, or flexible printed circuits is disposed; and
a grounded conductor,
wherein at least one of the flexible printed circuits is configured with an opening in a coverlay that is formed along an end of the respective flexible printed circuit, and wherein at least one of the flexible printed circuits is configured with at least a partially exposed ground plane and the exposed ground plane is electrically coupled to the grounded conductor over an electrical pathway that includes conductive foam or conductive adhesive.

10. The electronic device of claim 9 in which the grounded conductor is incorporated in the structural member of the electronic device.

11. The electronic device of claim 10 in which the structural member includes one of housing, enclosure, frame, fastener, boss, tab, stud, plate, bus, shield, cowling, flange, duct, cover, rib, stiffener, grounded surface, electrically conductive feature, hardware, or architecture.

12. The electronic device of claim 10 further including a battery and in which the grounded conductor is configured as a return electrical pathway for the battery.

13. The electronic device of claim 10 further including a thermal management system comprising a metallic component configured to dissipate thermal energy generated during operation of the electronic device and in which the grounded conductor is incorporated into at least a portion of the metallic component.

14. The electronic device of claim 10 further including an electro-magnetic interference (EMI) shielding system comprising one or more EMI shields and in which the grounded conductor is incorporated into at least a portion of an EMI shield.

15. The electronic device of claim 10 in which the ground plane in each flexible printed circuit, the electrical pathway, and the grounded conductor form a ground loop and wherein the coverlay openings are located in the electronic device to expose the ground planes so as to minimize ground loop length.

16. A method of assembling a sub-assembly that includes a flexible printed circuit and a structural member of an electronic device, the method comprising:
   assembling at least a portion of the flexible printed circuit with a receiving area of the structural member that is configured to receive the portion of the flexible printed circuit,
wherein the flexible printed circuit includes a coverlay that is formed along an end of the flexible printed circuit, and a ground plane that is at least partially exposed through an opening in the coverlay, and
wherein the structural member includes an electrically conductive component that is at ground potential for the electronic device when the electronic device is operated;
   applying a conductive material to the exposed ground plane in the flexible printed circuit; and
   establishing an electrical pathway between the conductive material and the ground potential component so that the ground plane of the flexible printed circuit is grounded when the electronic device is operated.

17. The method of claim 16 in which the conductive material is one of conductive foam, conductive adhesive, combination of conductive foam and conductive adhesive, solder, conductive ink, conductive paint, conductive grease, conductive paste, or conductive coating.

18. The method of claim 16 further including preparing a surface of the exposed ground plane in the flexible printed circuit prior to applying the conductive material.

19. The method of claim 18 in which the preparation includes one of cleaning or abrasion.

* * * * *